United States Patent
Cremin et al.

(10) Patent No.: US 7,349,676 B2
(45) Date of Patent: Mar. 25, 2008

(54) UPCONVERTER

(75) Inventors: Sean Cremin, Cork (IE); Jason Lynch, County Cork (IE); Brendan Lyons, County Cork (IE)

(73) Assignee: Farran Technology Limited, Cork (IE)

( * ) Notice: Subject to any disclaimer, the term of this patent is extended or adjusted under 35 U.S.C. 154(b) by 559 days.

(21) Appl. No.: 10/948,354

(22) Filed: Sep. 24, 2004

(65) Prior Publication Data
US 2005/0042993 A1     Feb. 24, 2005

Related U.S. Application Data

(63) Continuation of application No. PCT/IE03/00050, filed on Mar. 28, 2003.

(30) Foreign Application Priority Data
Mar. 28, 2002   (IE)   ................ 2002/0229

(51) Int. Cl.
H04B 1/04 (2006.01)
(52) U.S. Cl. ................ 455/118; 455/313
(58) Field of Classification Search ................ 455/20, 455/112, 118, 313, 318
See application file for complete search history.

(56) References Cited

U.S. PATENT DOCUMENTS

| | | | |
|---|---|---|---|
| 3,777,271 A | 12/1973 | Telewski | 327/119 |
| 4,245,355 A | 1/1981 | Pascoe et al. | 455/326 |
| 4,412,354 A | 10/1983 | Hu | 455/327 |
| 5,508,661 A * | 4/1996 | Keane et al. | 331/37 |
| 6,353,490 B1* | 3/2002 | Singer et al. | 398/66 |
| 2002/0118520 A1* | 8/2002 | Baker | 361/752 |

FOREIGN PATENT DOCUMENTS

| WO | WO00/55965 | 9/2000 |
|---|---|---|
| WO | WO02/07304 | 1/2002 |

* cited by examiner

Primary Examiner—Lee Nguyen
(74) Attorney, Agent, or Firm—Jacobson Holman PLLC

(57) ABSTRACT

An upconverter receives an intermediate frequency (IF) modulated signal on a port (5) and a local oscillator carrier signal at a port (6). A comb generator (13-15) generates a comb-like waveform from the carrier signal, the waveform having a peak for each of a number of multiples of the carrier fundamental. A bandpass filter (16) selects one of the comb peaks and there is further multiplication at a quadrupler (20). The modulated signal (IF) and the multiplied carrier are mixed in a mixer (23) to provide a high frequency upper sideband (LO+IF) output. The output is transmitted in a waveguide (7) which is integral with the casing (2, 3) and which performs high frequency filtering by virtue of its shape.

17 Claims, 4 Drawing Sheets

UPCONVERTER

This is a continuation of PCT/IE03/00050 filed Mar. 28, 2003 and published in English.

FIELD OF THE INVENTION

The invention relates to conversion of high frequency signals to higher frequencies for applications such as satellite or television communication.

An object of the invention is to perform such conversion with effective elimination of unwanted harmonics in an upconverter of compact size.

SUMMARY OF THE INVENTION

According to the invention, there is provided an upconverter comprising:
- an input port for receiving a modulated input signal,
- an input port for receiving a carrier signal,
- a comb generator for providing a comb-like waveform to the carrier signal, the waveform having a peak for each of a number of multiples of the fundamental frequency of the received carrier signal,
- a bandpass filter for selecting one of the comb peaks,
- a mixer for mixing the output of the comb generator and the bandpass filter with the received modulated input signal, and
- a bandpass filter for selecting the upper sideband of the mixer output.

In one embodiment, the comb generator comprises a power amplifier driving a step recovery diode to resonate with an inductor at a required harmonic.

In another embodiment, the upconverter further comprises a multiplier for multiplying the comb generator output before input to the mixer.

In a further embodiment, the multiplier multiplies by four.

In one embodiment, the multiplier is a MMIC multiplier.

In another embodiment, the upconverter further comprises an edge coupled microstrip bandpass filter to eliminate unwanted harmonics at the output of the MMIC multiplier.

In a further embodiment, the upconverter further comprises a resistor pad attenuator for the received carrier signal.

In one embodiment, the upconverter further comprises a low pass filter for eliminating higher frequencies for delivery of the carrier signal to the multiplier.

In another embodiment, the upconverter further comprises a resistor pad attenuator for attenuating the received modulated input signal before input to the mixer.

In a further embodiment, the upconverter further comprises an amplifier for amplifying the mixer output.

In one embodiment, the upconverter further comprises a high pass filter for delivering the output signal.

In another embodiment, the high pass filter is a mechanical waveguide machined in the casing.

In another embodiment, the waveguide has a stepped configuration reducing cross-sectional area at its input and a stepped configuration increasing cross-sectional area at its output.

In a further embodiment, the waveguide has a rectangular cross-section.

In one embodiment, the upconverter further comprises a transformer for interfacing between the waveguide and the preceding component, the transformer comprising a formation for low-pressure contact to a microstrip pattern on a substrate.

BRIEF DESCRIPTION OF THE DRAWINGS

The invention will be more clearly understood from the following description of some embodiments thereof, given by way of example only with reference to the accompanying drawings in which.

DETAILED DESCRIPTION OF THE INVENTION

Description of the Embodiments

Figure 1:
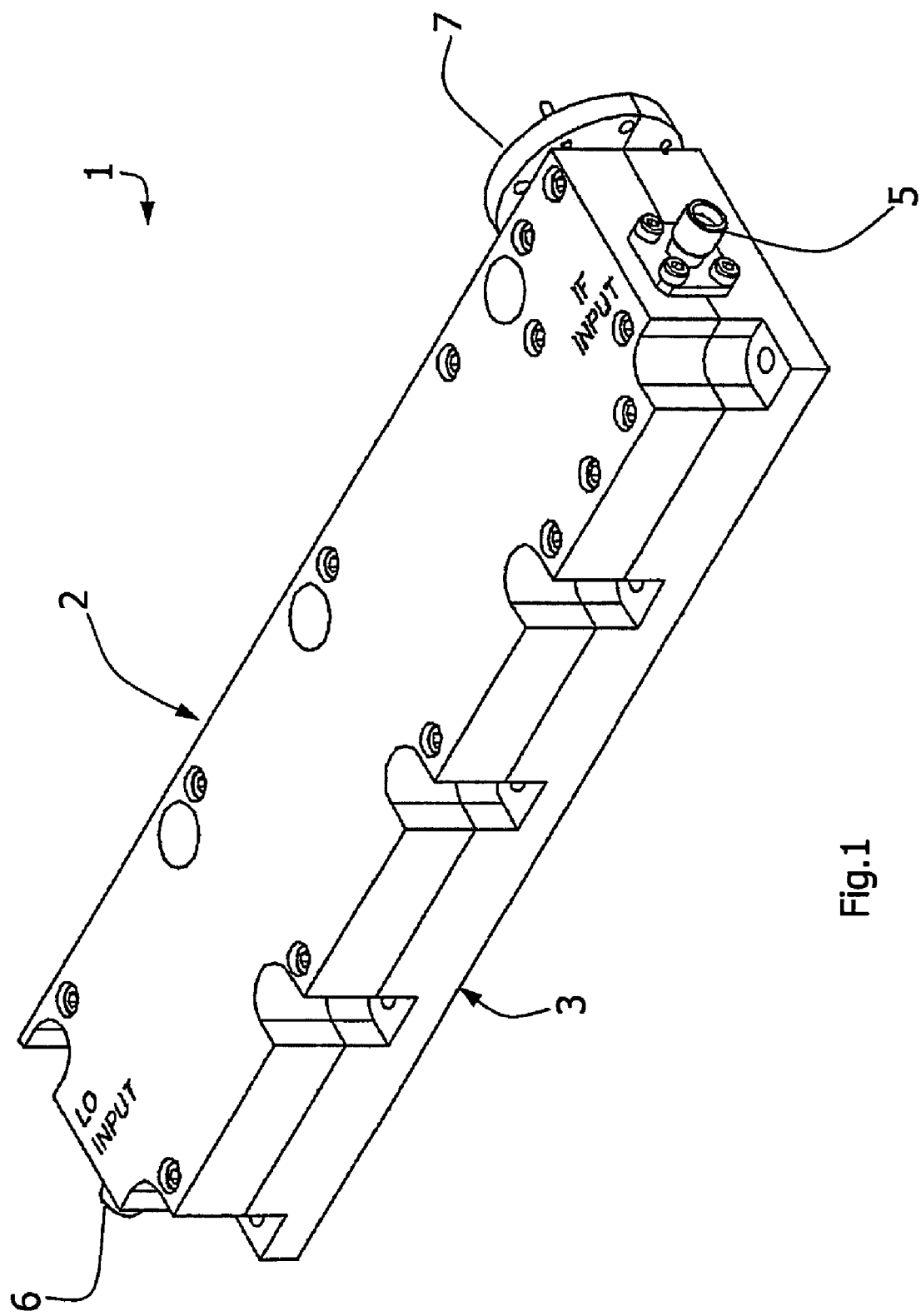
FIG. 1 is a perspective view of an upconverter of the invention.

Referring to FIG. 1 an upconverter 1 comprises top and bottom casing parts 2 and 3 of machined A1 material. The casing has an input port 5 for a modulated input signal, and input port 6 for a carrier input signal, and a waveguide 7 for a high frequency output. The modulated and carrier input signals are received on stiff cable, while the higher frequency output is transmitted in the waveguide 7.

The upconverter operates by multiplying the carrier signal (also referred to as a local oscillator, LO, signal) and mixing it with the input signal, (also referred to as the intermediate frequency, IF, signal). The IF signal is typically modulated with data. The upconverter 1 mixes the LO and the IF signals, providing LO+IF and LO−IF output frequencies. The upper sideband, namely LO+IF, is selected to provide the output. Typically, the IF frequency is 6.4-7.45 GHz and the output is in the 43.5 to 45.5 GHz band.

Figure 2:
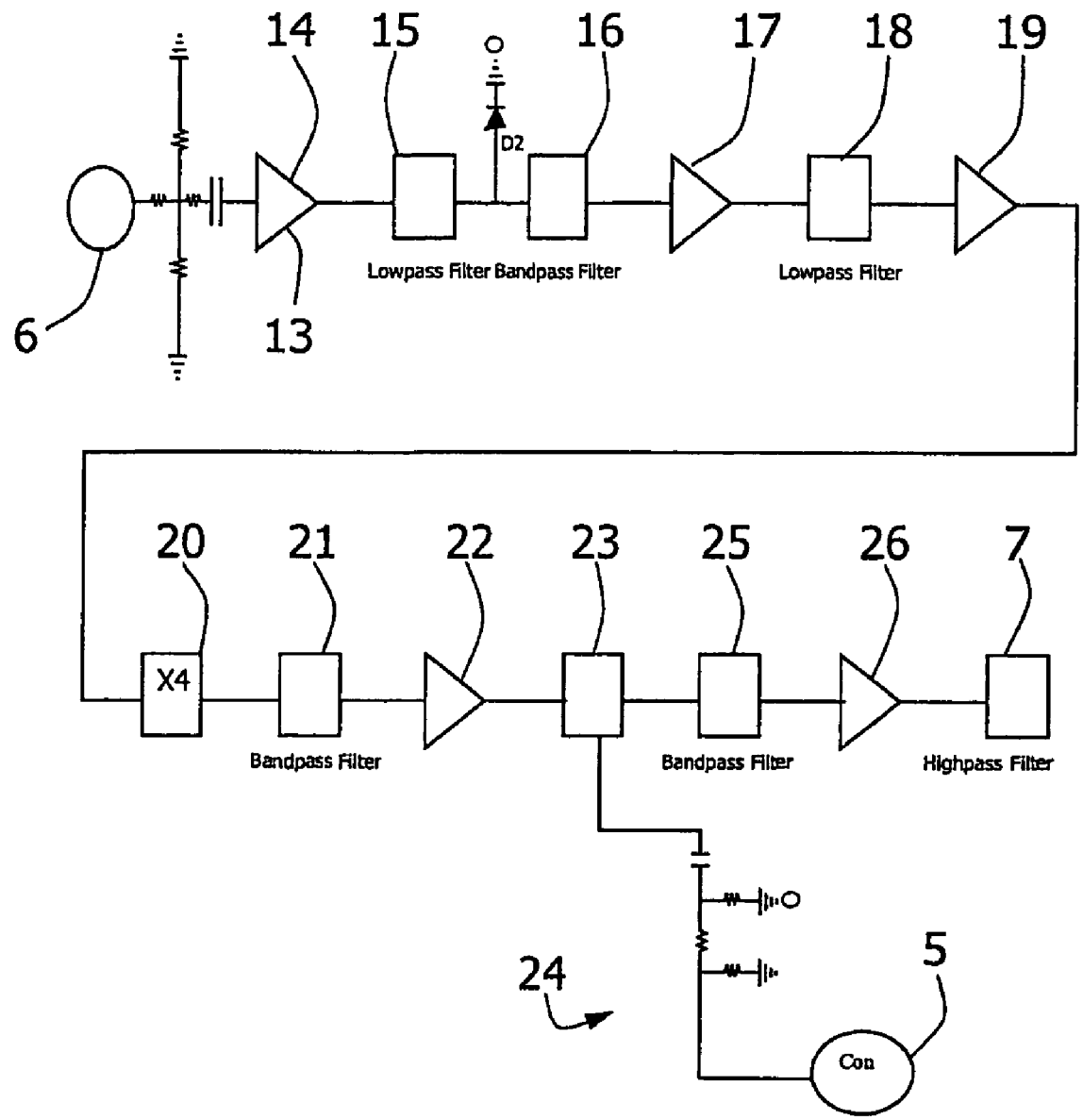
FIG. 2 is a schematic showing components of the upconverter.

Referring to FIG. 2, the LO (carrier) input is attenuated by a resistor pad 13 and is fed into an amplifier 14 driving a step recovery diode D2 matched via a low pass filter (LPF) 15. This sequence of components acts as a frequency comb generator, providing an N times multiplier of the LO input frequency where N has a practical upper limit of approximately 30. For example, in response to a 2 GHz input the comb will have 4, 6, 8 . . . GHz frequency levels in addition to the fundamental.

A bandpass filter 16 selects one specific component, in this case the seventh harmonic. An amplifier 17 boosts power of the selected seventh harmonic, and a low pass filter (LPF) 18 eliminates higher frequencies to improve effectiveness of the bandpass filtering operation. The resultant signal is amplified by an amplifier 19.

A MMIC (monolithic microwave integrated circuit) multiplier 20 multiplies the frequency by four while keeping the power level constant. A bandpass filter 21 cleans the waveform, and an amplifier 22 provides a required drive level for a MMIC mixer 23.

The IF received at the input port 5 passes through an attenuator pad 24 before input to the mixer 23.

The mixer 23 mixes the unconverted LO with intermediate frequency (IF), input from the port 5. The output is a signal which is the sum of the two (LO+IF, upper sideband). This is fed to a bandpass filter 25, which in turn feeds a final amplifier 26 to boost the output power. The highpass filter (HPF) 7 filters out frequencies lower than 60 GHz, to provide the final output.

Figure 3:
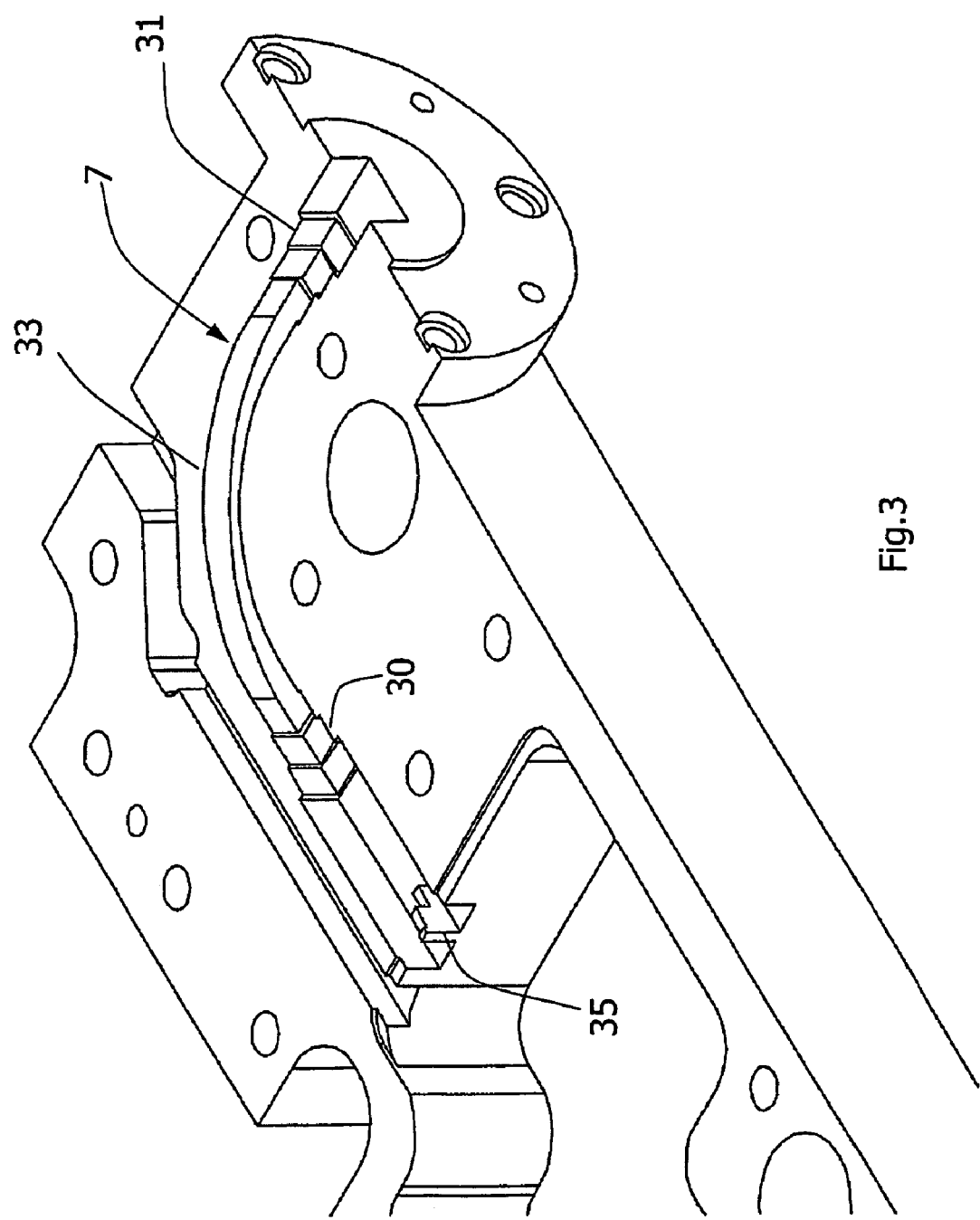
FIG. 3 is a perspective view of a casing part of the upconverter.
Figure 4:
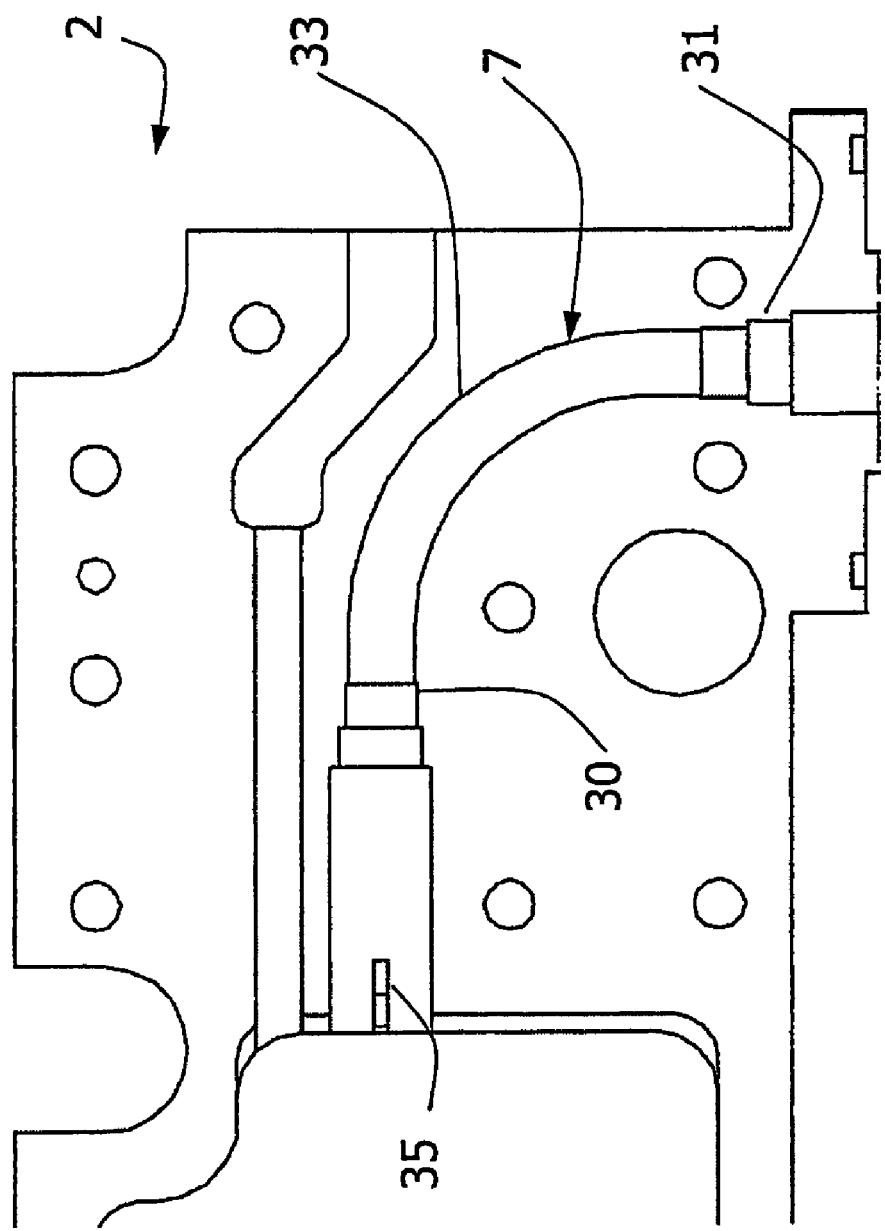
FIG. 4 is a plan view showing a mechanical high pass filter of the upconverter.

As shown in FIGS. 3 and 4, the HPF 7 is a waveguide structure which is machined into the casing of the unit. As shown in FIGS. 3 and 4 the HPF 7 has a rectangular cross-section, being stepped at 30 and 31 at each end to reduce cross-sectional area for a duct 33. It has been found that a combination of the bandpass filter 25 and the mechanically integrated HPF 7 provide a particularly clean output.

In more detail, in operation, the up-converter 1 up-coverts the band 6.4-7.45 GHz to the band 43.5-45.5 GHz using the $28^{th}$ harmonic of the frequencies 1.325 GHz and 1.36 GHz. This is accomplished with low levels of harmonic and spurious emissions. The $28^{th}$ harmonic is generated using the comb generator 13-16 and the quadrupler 20. The comb generator consists of the packaged power amplifier 14 driving the step recovery diode D2. This diode resonates with an inductor at the $7^{th}$ harmonic of the input. The result is a comb-like spectrum. The amplifier 14 is matched to the step recovery diode D2 using the low-pass filter 15. The wanted $7^{th}$ harmonic is selected from the comb using the edge coupled microstrip selector filter 16. This is designed to strongly reject the $6^{th}$ and $8^{th}$ harmonics. As the filter has repeated pass-bands at multiples of the wanted pass-band, these are rejected using the low-pass filter 18. The lowpass filter 18 is buffered from the selector filter 21 using the MMIC amplifier 20. Following the low-pass filter the MMIC quadrupler 20 produces the required $28^{th}$ harmonic. In addition the quadrupler 20 also produces $3^{rd}$ and $5^{th}$ harmonics of its input. These are rejected at the output using the edge coupled microstrip band-pass filter 21. The output of the filter 21 is the required local oscillator (LO) for the up-converter mixer 23.

The up-converter mixer 23 is a monolithic Schottky diode star mixer. The MMIC approach facilitates the achievement of excellent balance through precise lithography and matched diodes. The balance delivered by the mixer 23 facilitates the rejection of all spurious products with even harmonics. This is an advantageous feature for achievement of low spurious emissions from the up-converter 1.

The mixer 23 mixes, through the diode nonlinearity, the 6.4-7.45 GHz intermediate frequencies (IF) with the LO to create harmonics and sum and difference signals. The third edge coupled microstrip band-pass filter 25 passes the wanted band 43.4-45.5 GHz and rejects unwanted frequency products created in the mixer 23. Following the filter 25 the RF level is increased using the MMIC amplifier 26. The output is in the waveguide 7. A ridged waveguide transformer is the interface between the microstrip and the output waveguide 7. To improve the rejection of the LO the high-pass filter is built into the output waveguide 7.

Important features of the upconverter are:

(a) Operation of amplification stages and filter elements in the LO chain 13-22 to reject unwanted harmonics and spurious products and yet saturate the mixer 23. The mixer saturation minimises the impact of temperature variations on mixer conversion loss.

(b) The use of the MMIC mixer 23 with excellent balance.

(c) The attenuator pad 24 on the IF line to reduce the IF drive to the mixer 23 and so minimise harmonic generation. The pad 24 losses are compensated by increased gain in an RF amplifier of the mixer 23.

(d) A semi-rigid cable is used to connect the IF connector 5 to an IF track on the substrate. A coaxial to microstrip adapter bush is accommodated in the cable securing bracket to -minimise connection mismatches. The use of this cable also minimises the substrate size.

(e) Compartmentalisation of the comb generator and shielding of all band-pass filters to reduce the risk of unwanted coupling. The shielding is accomplished using metal covers that are epoxied to vias defining the filter edge.

(f) The output of the amplifier 26 interfaces with the waveguide 7 at a transformer 35 optimised using 3D electromagnetic simulation. The transformer 35 makes a low-loss pressure contact to the microstrip pattern on the soft substrate. The tolerancing allows the unit to be opened repeatedly and cycled thermally without contact deterioration. The casing part 2 incorporates the major features of the waveguide 7 and the transformer 35. The other casing part 3 is substantially flat, providing the fourth internal wall of the waveguide 7 and supporting the circuit component substrate.

(g) The integrated highpass filter 7 in the output waveguide to reject LO leakage. This filter is machined into the cover and forms a bend needed to correctly align the output port with mating system parts.

(h) The use of pedestals to minimise step discontinuities between the MMICs and the substrate pattern. The pedestal height compensates for the difference in height between the MMIC and the substrate.

(i) The fabrication of the RF filter 25 on 100 um quartz. This delivers good line and gap resolution and so accurate filter realisation. It also matches the thicknesses of the mixer and RF amplifier MMICs, allowing the parts to be butted together on the same pedestal, thus minimising interconnection parasitics. It also improves the field mismatch over that experienced with a soft substrate.

(j) Bias regulators are integrated on the same substrate to minimise interconnects and reduce size.

The invention is not limited to the embodiments described but may be varied in construction and detail.

The invention claimed is:

1. An upconverter comprising:
an input port for receiving a modulated input signal,
an input port for receiving a carrier signal,
a comb generator for providing a comb-like waveform to the carrier signal, the waveform having a peak for each of a number of multiples of the fundamental frequency of the received carrier signal,
a bandpass filter for selecting one of the comb peaks,
a mixer for mixing the output of the comb generator and the bandpass filter with the received modulated input signal,
a bandpass filter for selecting the upper sideband of the mixer output,
a MMIC multiplier for multiplying the comb generator output before input to the mixer, and
an edge coupled microstrip bandpass filter to eliminate unwanted harmonics at the output of the MMIC multiplier.

2. The upconverter as claimed in claim 1, wherein the comb generator comprises a power amplifier driving a step recovery diode to resonate with an inductor at a required harmonic.

3. The upconverter as claimed in claim 1, wherein the multiplier multiplies by four.

4. The upconverter as claimed in claim 1, wherein the upconverter further comprises a resistor pad attenuator for the received carrier signal.

5. The upconverter as claimed in claim 1, further comprising a low pass filter for eliminating higher frequencies for delivery of the carrier signal to the multiplier.

6. The upconverter as claimed in claim 1, further comprising a resistor pad attenuator for attenuating the received modulated input signal before input to the mixer.

7. The upconverter as claimed in claim 1, further comprising an amplifier for amplifying the mixer output.

8. The upconverter as claimed in claim 1, further comprising a high pass filter for delivering the output signal.

9. The upconverter as claimed in claim 8, wherein the high pass filter is a mechanical waveguide machined in the casing.

10. The upconverter as claimed in claim 9, wherein the waveguide has a stepped configuration reducing cross-sectional area at its input and a stepped configuration increasing cross-sectional area at its output.

11. The upconverter as claimed in claim 9, wherein the waveguide has a rectangular cross-section.

12. The upconverter as claimed in claim 9, further comprising a transformer for interfacing between the waveguide and the preceding component, the transformer comprising a formation for low-pressure contact to a microstrip pattern on a substrate.

13. An upconverter comprising:
an input port for receiving a modulated input signal,
an input port for receiving a carrier signal,
a comb generator for providing a comb-like waveform to the carrier signal, the waveform having a peak for each of a number of multiples of the fundamental frequency of the received carrier signal,
a bandpass filter for selecting one of the comb peaks,
a mixer for mixing the output of the comb generator and the bandpass filter with the received modulated input signal,
a bandpass filter for selecting the upper sideband of the mixer output,
a multiplier for multiplying the comb generator output before input to the mixer, and
a low pass filter for eliminating higher frequencies for delivery of the carrier signal to the multiplier.

14. An upconverter comprising:
an input port for receiving a modulated input signal,
an input port for receiving a carrier signal,
a comb generator for providing a comb-like waveform to the carrier signal, the waveform having a peak for each of a number of multiples of the fundamental frequency of the received carrier signal,
a bandpass filter for selecting one of the comb peaks,
a mixer for mixing the output of the comb generator and the bandpass filter with the received modulated input signal,
a bandpass filter for selecting the upper sideband of the mixer output, and
a high pass filter for delivering the output signal,
the high pass filter being a mechanical waveguide machined in the casing.

15. The upconverter as claimed in claim 14, wherein the waveguide has a stepped configuration reducing cross-sectional area at its input and a stepped configuration increasing cross-sectional area at its output.

16. The upconverter as claimed in claim 14, wherein the waveguide has a rectangular cross-section.

17. The upconverter as claimed in claim 14, further comprising a transformer for interfacing between the waveguide and the preceding component, the transformer comprising a formation for low-pressure contact to a microstrip pattern on a substrate.

* * * * *